United States Patent
Kao et al.

(10) Patent No.: US 10,936,018 B2
(45) Date of Patent: Mar. 2, 2021

(54) ELECTRONIC DEVICE HAVING MAGNETIC ATTRACTION POSITIONING MECHANISM

(71) Applicants: Hsing-Yi Kao, Taipei (TW);
Ming-Chung Liu, Taipei (TW);
Tung-Ying Wu, Taipei (TW);
Kuan-Chang Lee, Taipei (TW)

(72) Inventors: Hsing-Yi Kao, Taipei (TW);
Ming-Chung Liu, Taipei (TW);
Tung-Ying Wu, Taipei (TW);
Kuan-Chang Lee, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/436,922

(22) Filed: Jun. 11, 2019

(65) Prior Publication Data
US 2019/0377387 A1    Dec. 12, 2019

Related U.S. Application Data

(60) Provisional application No. 62/683,030, filed on Jun. 11, 2018.

(51) Int. Cl.
*G06F 1/16*   (2006.01)
*H05K 5/02*   (2006.01)
*H05K 5/00*   (2006.01)

(52) U.S. Cl.
CPC .......... *G06F 1/1656* (2013.01); *G06F 1/1616* (2013.01); *G06F 1/1626* (2013.01); *H05K 5/0017* (2013.01); *H05K 5/0239* (2013.01)

(58) Field of Classification Search
CPC ........ A45C 2011/003; A45C 2011/002; A45C 13/1069; G06F 1/1632; G06F 1/1626;
(Continued)

(56) References Cited

U.S. PATENT DOCUMENTS 9,823,701 B2 * 11/2017 MacDonald .......... G06F 1/1654
9,935,669 B1 * 4/2018 Kuo ..................... H04B 1/3888
(Continued)

FOREIGN PATENT DOCUMENTS

CN    202941561    5/2013
TW    201110844    3/2011
(Continued)

OTHER PUBLICATIONS

"Office Action of Taiwan Counterpart Application", dated Aug. 3, 2020, p. 1-p. 14.

Primary Examiner — James Wu
(74) Attorney, Agent, or Firm — JCIPRNET

(57) ABSTRACT

An electronic device includes a supporting plate, at least one main positioning magnet and a body. The supporting plate has an edge. The supporting plate is provided with a first positioning magnet structure therein. The main positioning magnet is disposed at the supporting plate. The body is movably disposed at the supporting plate, wherein the body has a first axis and a second axis intersected with the first axis. The body is provided with a main auxiliary magnet and a first auxiliary magnet structure therein. The main auxiliary magnet is located at the intersection of the first axis and the second axis, and the first auxiliary magnet structure is located on the first axis. The main auxiliary magnet is configured to be aligned with the main positioning magnet and magnetically attracted to the main positioning magnet.

14 Claims, 14 Drawing Sheets

(58) Field of Classification Search
CPC .... G06F 1/1616; G06F 1/1628; G06F 1/1624; G06F 1/1656; H05K 5/0017; H05K 5/0239
See application file for complete search history.

(56) References Cited

U.S. PATENT DOCUMENTS

2018/0249798 A1    9/2018  Hurst et al.
2018/0335803 A1*  11/2018  Jan ..................... H02J 7/0044

FOREIGN PATENT DOCUMENTS

| TW | M482773 | 7/2014 |
| TW | M546074 | 7/2017 |

* cited by examiner

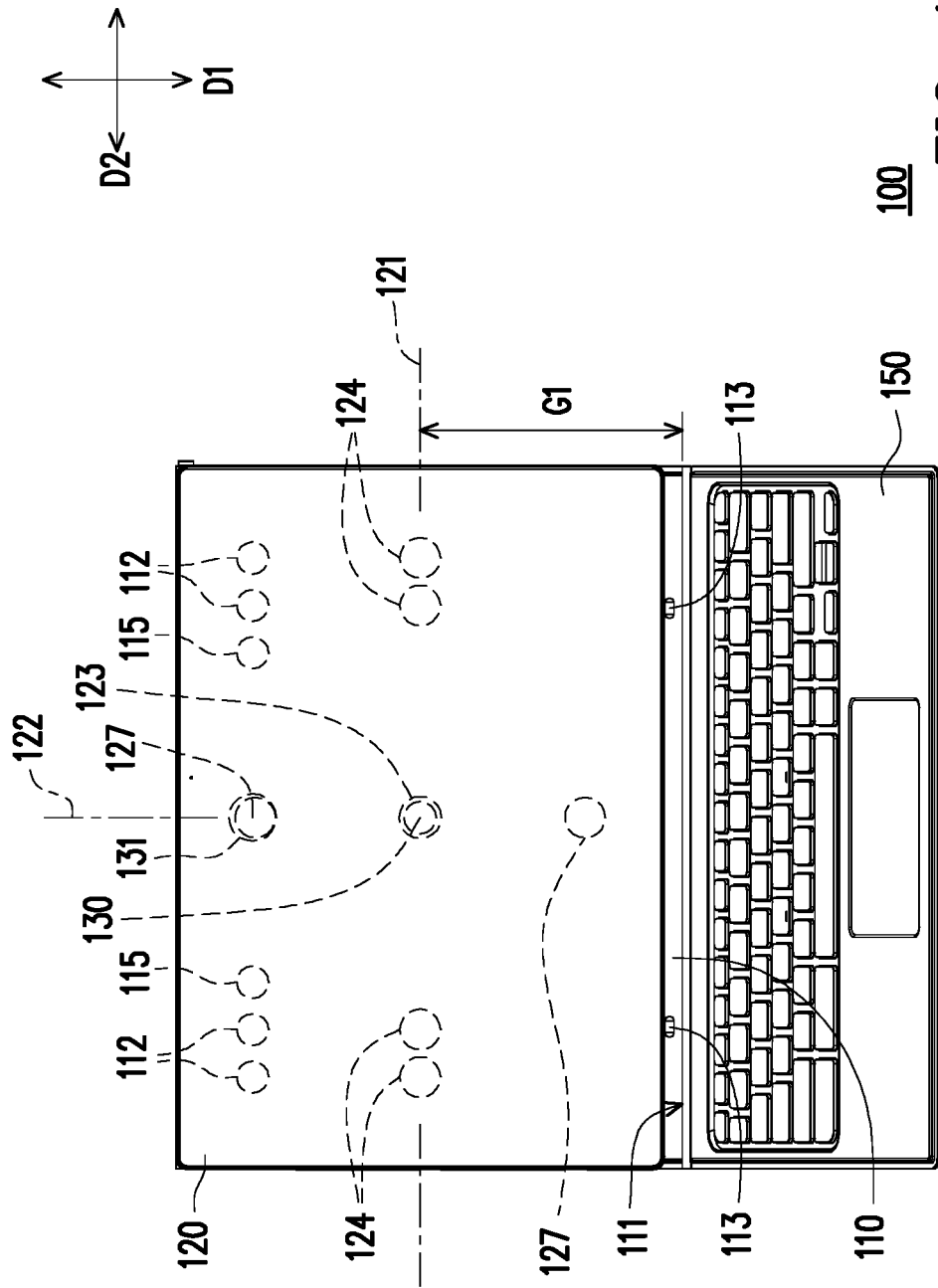

ELECTRONIC DEVICE HAVING MAGNETIC ATTRACTION POSITIONING MECHANISM

CROSS REFERENCE TO RELATED APPLICATION

This application claims the priority benefit of U.S. provisional application Ser. No. 62/683,030, filed on Jun. 11, 2018. The entirety of the above-mentioned patent application is hereby incorporated by reference herein and made a part of specification.

BACKGROUND

Technical Field

The present disclosure relates to an electronic device, and more particularly to an electronic device incorporated with a magnetic attraction positioning mechanism.

Description of Related Art

Since a tablet computer is easy to carry, and its display screen size is larger than that of the smart phone, it is gradually favored by consumers. In order to improve the convenience of operating the tablet computer, reduce the user's fatigue or discomfort caused by holding the tablet computer for a long time, and avoid damage caused by the collision of the tablet computer, a bracket-type protecting cover is proposed.

Specifically, the bracket type protecting cover may include a cover plate, a back plate connected to the cover plate, and a bracket connected to the back plate, wherein the tablet computer is mounted to the back plate, and the tablet computer and the bracket are located at two opposite sides of the back plate. The cover plate can be configured to cover the display screen of the tablet computer to prevent the tablet computer from being damaged by collision. If the cover plate is unfolded relative to the back plate and the tablet computer disposed thereon, and the bracket is unfolded relative to the back plate, the cover plate and the bracket are configured to abut against the tabletop to support the back plate and the tablet computer disposed thereon. Meanwhile, the back plate and the tablet computer disposed thereon are made to incline on the tabletop, thereby improving the convenience of operating the tablet computer.

In general, after the tablet computer is disposed on the back cover of the bracket-type protecting cover, the user can only adjust the tilt angle of the tablet computer relative to the desktop, and cannot slide the tablet computer on the back cover or make the tablet computer rotate relative to the back cover, which makes it difficult to meet the user's needs for diverse operation modes.

SUMMARY

The present disclosure provides an electronic device having a variety of operation modes.

The electronic device of the present disclosure includes a supporting plate, at least one main positioning magnet, and a body. The supporting plate has an edge. The supporting plate is provided with a first positioning magnetic structure therein. The main positioning magnet is disposed at the supporting plate. The body is movably disposed at the supporting plate, wherein the body has a first axis and a second axis intersected with the first axis, and the body is provided with a main auxiliary magnet and a first auxiliary magnetic structure therein. The main auxiliary magnet is located at an intersection of the first axis and the second axis, and the first auxiliary magnetic structure is located on the first axis. The main auxiliary magnet is configured to be aligned with the main positioning magnet and magnetically attracted to the main positioning magnet.

In an embodiment of the disclosure, the number of the main positioning magnet is two, and the two main positioning magnets are arranged along a direction perpendicular to the edge. One of the two main positioning magnets is spaced apart from the edge by a first distance, and the other of the two main positioning magnets is spaced apart from the edge by a second distance, wherein the second distance is greater than the first distance.

In an embodiment of the disclosure, the first positioning magnetic structure is spaced apart from the edge by a second distance.

In an embodiment of the disclosure, the body is further provided with a second auxiliary magnetic structure therein located on the second axis, and the supporting plate is further provided with a second positioning magnetic structure therein, wherein the second positioning magnetic structure is located between the main positioning magnet and the first positioning magnetic structure, and the second positioning magnetic structure is spaced apart from the edge by a second distance.

In an embodiment of the disclosure, the main positioning magnet is spaced apart from the edge by a second distance. The main auxiliary magnet is aligned with the main positioning magnet and is magnetically attracted to the main positioning magnet. The body rotates relative to the supporting plate through the coordination of the main auxiliary magnet and the main positioning magnet such that the second axis is parallel to the edge. The second auxiliary magnetic structure is aligned with the second positioning magnetic structure and is magnetically attracted to the second positioning magnetic structure.

In an embodiment of the disclosure, the body has a plurality of corners, and a distance between any of the corners and the main auxiliary magnet is smaller than the second distance.

In an embodiment of the disclosure, the supporting plate has a sliding slot extending in a direction perpendicular to the edge, and the main positioning magnet is slidably disposed in the sliding slot.

In an embodiment of the disclosure, the sliding slot has a first end close to the edge and a second end away from the edge. The main positioning magnet is positioned at the first end and spaced apart from the edge by a first distance, and the main positioning magnet is positioned at the second end and spaced apart from the edge by a second distance.

In an embodiment of the disclosure, the electronic device further includes a sliding member and a lateral magnetic positioning member, wherein the sliding member is slidably disposed in the supporting plate, and the sliding member includes a first sliding portion located inside the sliding slot and a second sliding portion located outside the sliding slot. The main positioning magnet is disposed at the first sliding portion, and the lateral magnetic positioning member is disposed at the second sliding portion.

In an embodiment of the disclosure, the supporting plate is further provided with a terminal magnetic positioning member therein, and the terminal magnetic positioning member is located at a side of the second end of the sliding slot and is spaced apart from the edge by a second distance, wherein the terminal magnetic positioning member is located on the moving path of the lateral magnetic positioning member.

In an embodiment of the disclosure, the supporting plate is further provided a transitional magnetic positioning member therein located between the edge and the terminal magnetic positioning member, and the transitional magnetic positioning member is located at a side of the sliding slot and is spaced apart from the edge by a third distance, wherein the transitional magnetic positioning member is located on the moving path of the lateral magnetic positioning member, and the third distance is between the first distance and the second distance.

In an embodiment of the disclosure, the supporting plate is further provided with a middle positioning magnetic structure therein, and the middle positioning magnetic structure is spaced apart from the edge by a third distance. The middle positioning magnetic structure is located on the moving path of the first auxiliary magnetic structure.

In an embodiment of the disclosure, the main positioning magnet has a first engaging portion, and the sliding slot is provided with a plurality of second engaging portions therein. One of the second engaging portions is located at a first end, and the other of the second engaging portions is located at a second end.

In an embodiment of the disclosure, another one of the second engaging portions is located between the first end and the second end.

In an embodiment of the disclosure, the main positioning magnet is spaced apart from the edge by a first distance. The main auxiliary magnet is aligned with the main positioning magnet and is magnetically attracted to the main positioning magnet, wherein the main auxiliary magnet is spaced apart from the edge by the first distance, and the first auxiliary magnetic structure is spaced apart from the edge by the first distance.

In an embodiment of the disclosure, the first axis is parallel to the edge.

In an embodiment of the disclosure, the supporting plate includes a supporting portion adjacent to the edge, and the body abuts against the supporting portion.

In an embodiment of the disclosure, the main positioning magnet is spaced apart from the edge by a second distance. The main auxiliary magnet is aligned with the main positioning magnet and is magnetically attracted to the main positioning magnet. The first auxiliary magnetic structure is aligned with the first positioning magnetic structure and is magnetically attracted to the first positioning magnetic structure. The main auxiliary magnet is spaced apart from the edge by a second distance, and the first auxiliary magnetic structure is spaced apart from the edge by the second distance.

In an embodiment of the disclosure, the supporting plate includes a supporting portion adjacent to the edge, and the body and the supporting portion are separated.

In an embodiment of the disclosure, the body has a plurality of corners, and a distance between any of the corners and the main auxiliary magnet is smaller than the second distance.

In an embodiment of the disclosure, the supporting plate has a bearing surface, and the main positioning magnet includes a positioning protrusion protruding from the bearing surface. The body has a leaning surface and a positioning recess located on the leaning surface. The auxiliary magnet is located in the positioning recess, the leaning surface abuts against the bearing surface, and the positioning protrusion is embedded in the positioning recess.

In an embodiment of the disclosure, the electronic device further includes a bracket. The bracket is connected to the supporting plate, and the bracket and the body are located at two opposite sides of the supporting plate.

In an embodiment of the disclosure, the electronic device further includes an input device. The input device is connected to the edge of the supporting plate, and the bracket and the input device are located at two opposite sides of the supporting plate.

Based on the above, the electronic device of the present disclosure includes a body and a supporting plate for carrying the body, and the user can adjust the position or the direction of the body on the supporting plate according to individual needs, so as to obtain different operation modes. On the other hand, the electronic device of the present disclosure adopts a magnetic attraction positioning mechanism. When the position or the direction of the body on the supporting plate is adjusted, the body can be positioned on the supporting plate through the magnetic attraction positioning mechanism, so the body would not slide or rotate arbitrarily relative to the supporting plate, thereby improving the reliability in operating the electronic device.

In order to make the aforementioned features and advantages of the disclosure more comprehensible, embodiments accompanying figures are described in detail below.

BRIEF DESCRIPTION OF THE DRAWINGS

FIG. 1B is a schematic front view of the electronic device in a first operation mode according to the first embodiment of the present disclosure.

DESCRIPTION OF THE EMBODIMENTS

Figure 1A:
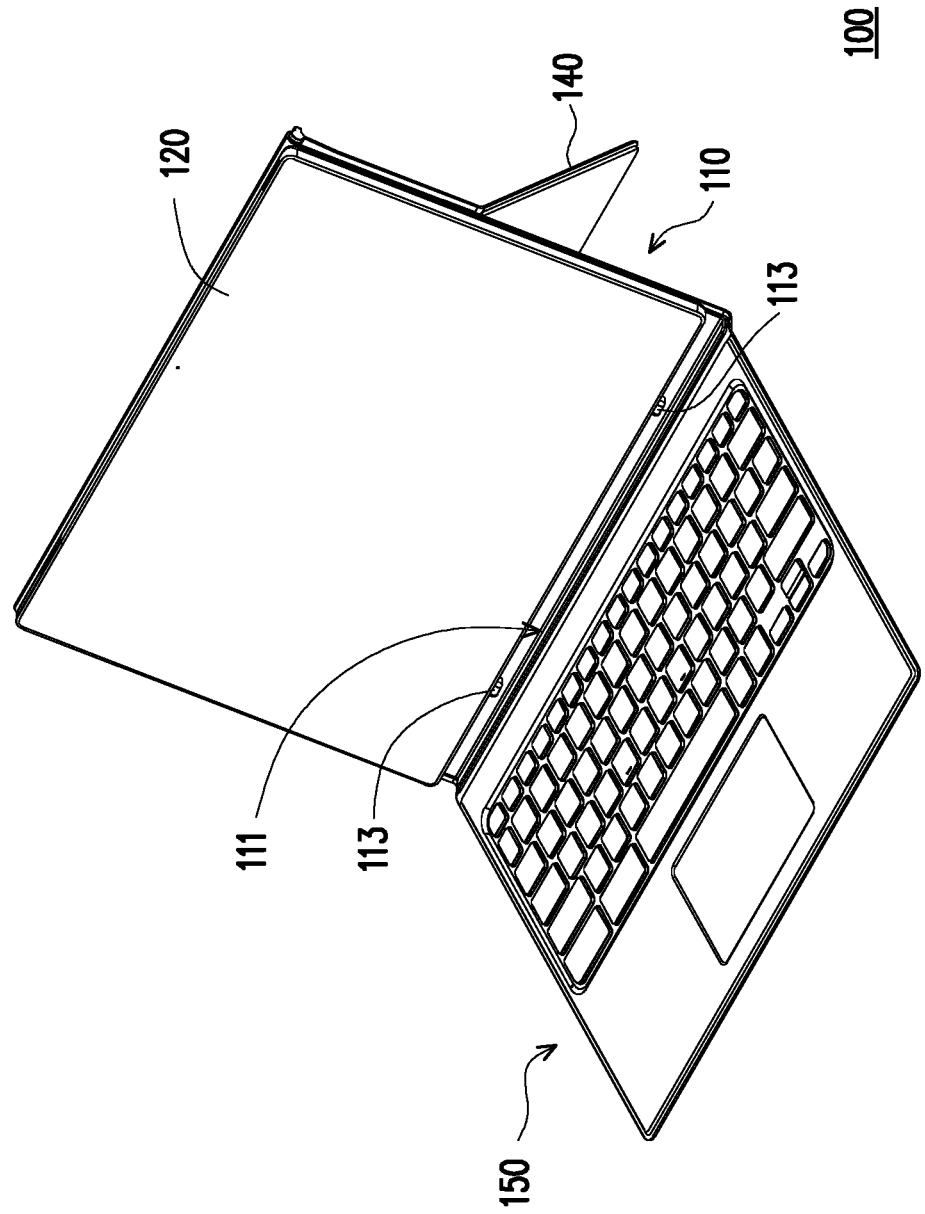
FIG. 1A is a schematic view of an electronic device according to a first embodiment of the present disclosure.
Figure 1C:
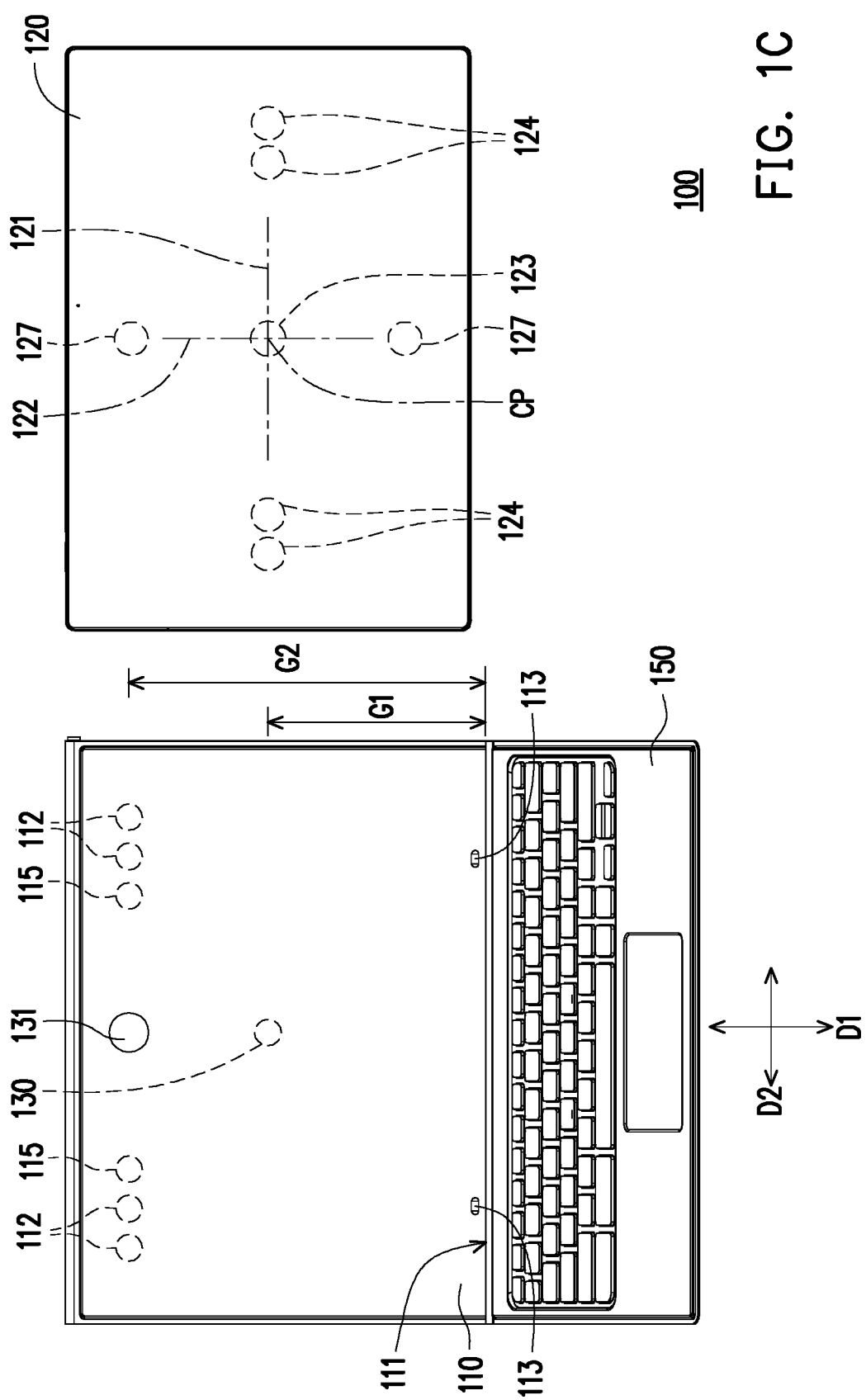
FIG. 1C is a schematic front view of the body of FIG. 1B separated from a supporting plate.

FIG. 1A is a schematic view of an electronic device according to a first embodiment of the present disclosure. FIG. 1B is a schematic front view of the electronic device in a first operation mode according to the first embodiment of the present disclosure. FIG. 1C is a schematic front view of the body of FIG. 1B separated from a supporting plate. Referring to FIG. 1A, in the embodiment, an electronic device 100 may be a combination of a tablet computer and a protecting cover, a combination of a tablet computer and a docking base, or a combination of a tablet computer and a supporting frame, wherein the electronic device 100 includes a supporting plate 110 and a body 120, wherein the supporting plate 110 may be a part of the protecting cover, the docking base or the supporting base, and is configured to bear the body 120.

The body 120 may be a tablet computer or other portable device, wherein the position or the direction of the body 120 on the supporting plate 110 can be adjusted according to the needs of the user to obtain different operation modes. Further, the electronic device 100 adopts a magnetic attraction positioning mechanism. When the position or direction of the body 120 on the supporting plate 110 is adjusted, the body 120 can be positioned on the supporting plate 110 through the magnetic attraction positioning mechanism. Therefore, the body 120 would not slide or rotate arbitrarily relative to the supporting plate 110, thereby improving the reliability in operating the electronic device 100.

Referring to FIG. 1A to FIG. 1C, the electronic device 100 is in the first operation mode, and the height of the body 120 from the desktop (not shown) is low. In the present embodiment, the supporting plate 110 has an edge 111 (for example, a long edge), and the supporting plate 110 is provided with a first positioning magnetic structure 112 therein. On the other hand, the electronic device 100 further includes a first main positioning magnet 130 and a second main positioning magnet 131, wherein the first main positioning magnet 130 and the second main positioning magnet 131 are both disposed at the supporting plate 110. The first main positioning magnet 130 may be disposed inside the supporting plate 110, and at least a portion of the second main positioning magnet 131 may be exposed from the supporting plate 110.

Further, the first main positioning magnet 130 and the second main positioning magnet 131 are arranged along a direction D1 perpendicular to the edge 111, and the first main positioning magnet 130 and the second main positioning magnet 131 are substantially located on the center line of the edge 111 of the supporting plate 110. The center point of the first main positioning magnet 130 is spaced apart from the edge 111 by a first distance G1, and the center point of the second main positioning magnet 131 is spaced apart from the edge 111 by a second distance G2. The first distance G1 is smaller than the second distance G2, so the first main positioning magnet 130 is located between the edge 111 and the second main positioning magnet 131.

On the other hand, the body 120 has a first axis 121 and a second axis 122 intersected with the first axis 121, wherein the first axis 121 may be a center line passing through the short edge of the body 120, and the second axis 122 may be a center line passing through the long edge of the body 120. The first axis 121 and the second axis 122 can be perpendicular to each other. The body 120 is provided with a main auxiliary magnet 123 and a first auxiliary magnetic structure 124 therein, wherein the main auxiliary magnet 123 is located at an intersection CP of the first axis 121 and the second axis 122, and the intersection CP may be a geometric center of the body 120.

In the first operation mode of the electronic device 100, the first axis 121 of the body 120 is parallel to the edge 111 of the supporting plate 110, and the main auxiliary magnet 123 is aligned (or overlapped) with the first main positioning magnet 130 and is magnetically attracted to the first main positioning magnet 130, thereby positioning the body 120 on the supporting plate 110. On the other hand, the supporting plate 110 includes a supporting portion 113 adjacent to the edge 111, wherein the number of the supporting portion 113 may be at least two, and the supporting portions 113 are arranged along a direction D2 parallel to the edge 111, and are symmetrically disposed at two opposite sides of the first main positioning magnet 130.

In the case where the first axis 121 of the body 120 is parallel to the edge 111 of the supporting plate 110, and the main auxiliary magnet 123 in the body 120 is aligned (or overlapped) with the first main positioning magnet 130 in the supporting plate 110, the body 120 abuts against the supporting portions 113. The coordination of the main auxiliary magnet 123 and the first main positioning magnet 130 and the supporting portions 113 generate at least three positioning points on the body 120, so that the body 120 would not slide or rotate arbitrarily relative to the supporting plate 110, as such the electronic device 100 is stably maintained in the first operation mode. On the other hand, the main auxiliary magnet 123 that is aligned (or overlapped) with the first main positioning magnet 130 is also spaced apart from the edge 111 by the first distance G1.

Referring to FIG. 1A, the electronic device 100 further includes a bracket 140 and an input device 150, wherein the bracket 140 is connected to the supporting plate 110, and the bracket 140 and the body 120 are located at two opposite sides of the supporting plate 110. The bracket 140 can be unfolded relative to the supporting plate 110 or cover the supporting plate 110. After the bracket 140 is unfolded relative to the supporting plate 110, the bracket 140 and the supporting plate 110 can support the body 120 together. On the other hand, the input device 150 is connected to the edge 111 of the supporting plate 110, and the bracket 140 and the input device 150 are located at two opposite sides of the supporting plate 110. The input device 150 can be unfolded relative to the supporting plate 110 or cover the supporting plate 110. After the input device 150 is unfolded relative to the supporting plate 110, the input device 150 and the supporting plate 110 can support the body 120 together. If the bracket 140 and the input device 150 are both unfolded relative to the supporting plate 110, the body 120 is supported by the supporting plate 110, the bracket 140, and the input device 150.

The input device 150 may include a touch pad and a keyboard set, or only include a keyboard set, and can be electrically connected to the body 120. For example, the first main positioning magnet 130 in the supporting plate 110 and the main auxiliary magnet 123 in the body 120 may be integrated with a wireless transmission function, respectively. When the main auxiliary magnet 123 in the body 120 is aligned (or overlapped) with the first main magnet 130 in the supporting plate 110, the main auxiliary magnet 123 and the first main positioning magnet 130 can be paired and linked to transmit signals or electric power. On the other hand, the input device 150 is electrically connected to the main auxiliary magnet 123 in the supporting plate 110 to be electrically connected to the body 120 through the main auxiliary magnet 123 and the first main positioning magnet 130. Specifically, in other embodiments, the electronic device may be provided with a bracket, but not provided with the input device. Alternatively, the electronic device may be provided with an input device but without a bracket.

Referring to FIG. 1B and FIG. 1C, in the embodiment, the first positioning magnetic structure 112 is spaced apart from the edge 111 by the second distance G2, and the first auxiliary magnetic structure 124 is located on the first axis 121. For example, the first positioning magnetic structure 112 may include a plurality of magnets arranged along the direction D2, wherein the first positioning magnetic structure 112 is symmetrically disposed at two opposite sides of the second main positioning magnet 131, and the connecting line between the first positioning magnetic structure 112 and the second main positioning magnet 131 is substantially parallel to the edge 111. On the other hand, the first auxiliary magnetic structure 124 may include a plurality of magnets arranged along the first axis 121, wherein the first positioning magnetic structure 112 is symmetrically disposed at two opposite sides of the main auxiliary magnet 123, and the number of the magnets of the first auxiliary magnetic structure 124 is substantially the same as the number of the magnets of the first positioning magnetic structure 112.

If the body 120 shown in FIG. 1B moves away from the supporting portion 113 along the direction D1, the second main positioning magnet 131 is located on the moving path of the main auxiliary magnet 123, and the first positioning magnetic structure 112 is located on the moving path of the first auxiliary magnetic structure 124.

Figure 1D:
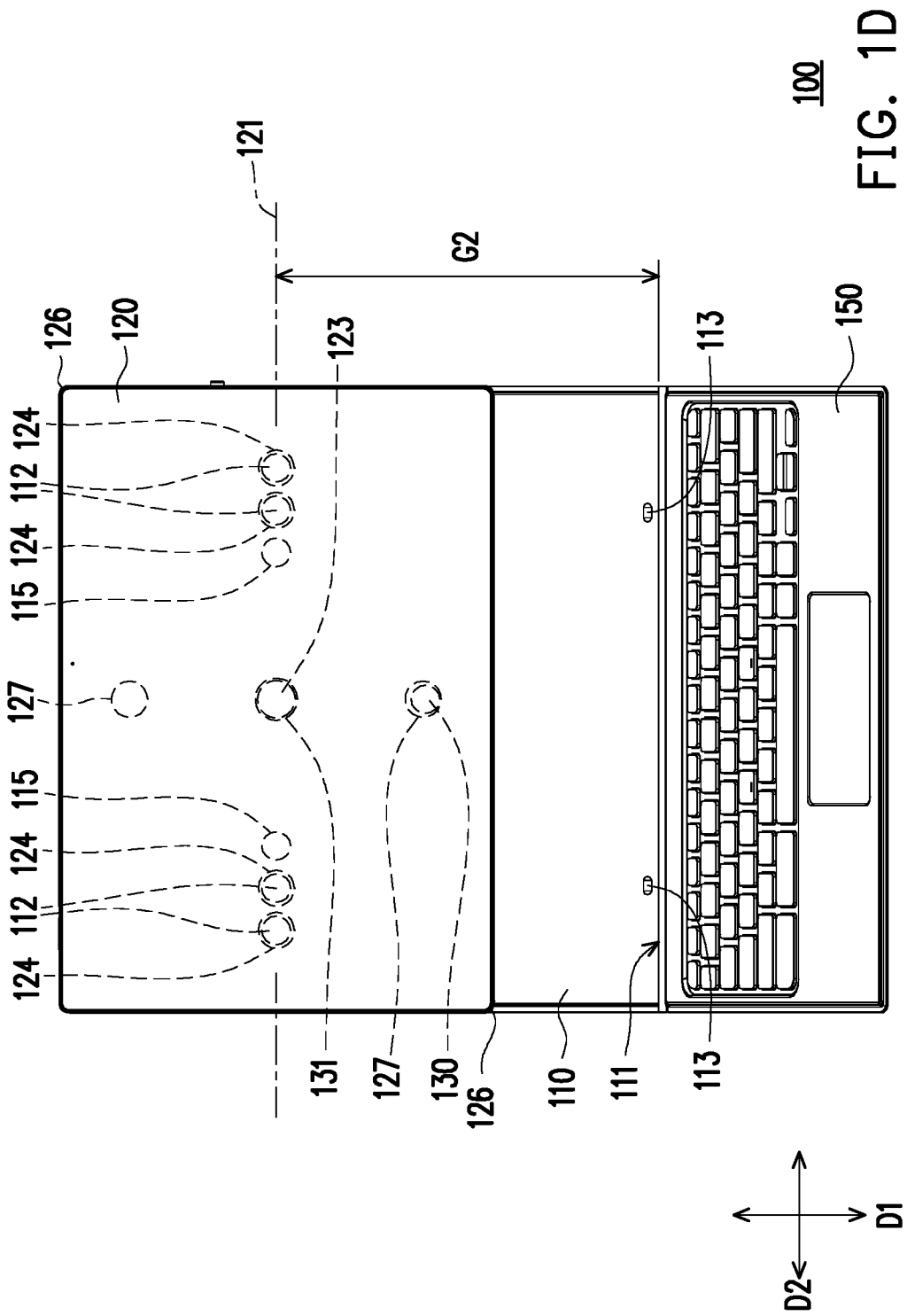
FIG. 1D is a schematic front view of the electronic device in a second operation mode according to the first embodiment of the present disclosure.
Figure 1E:
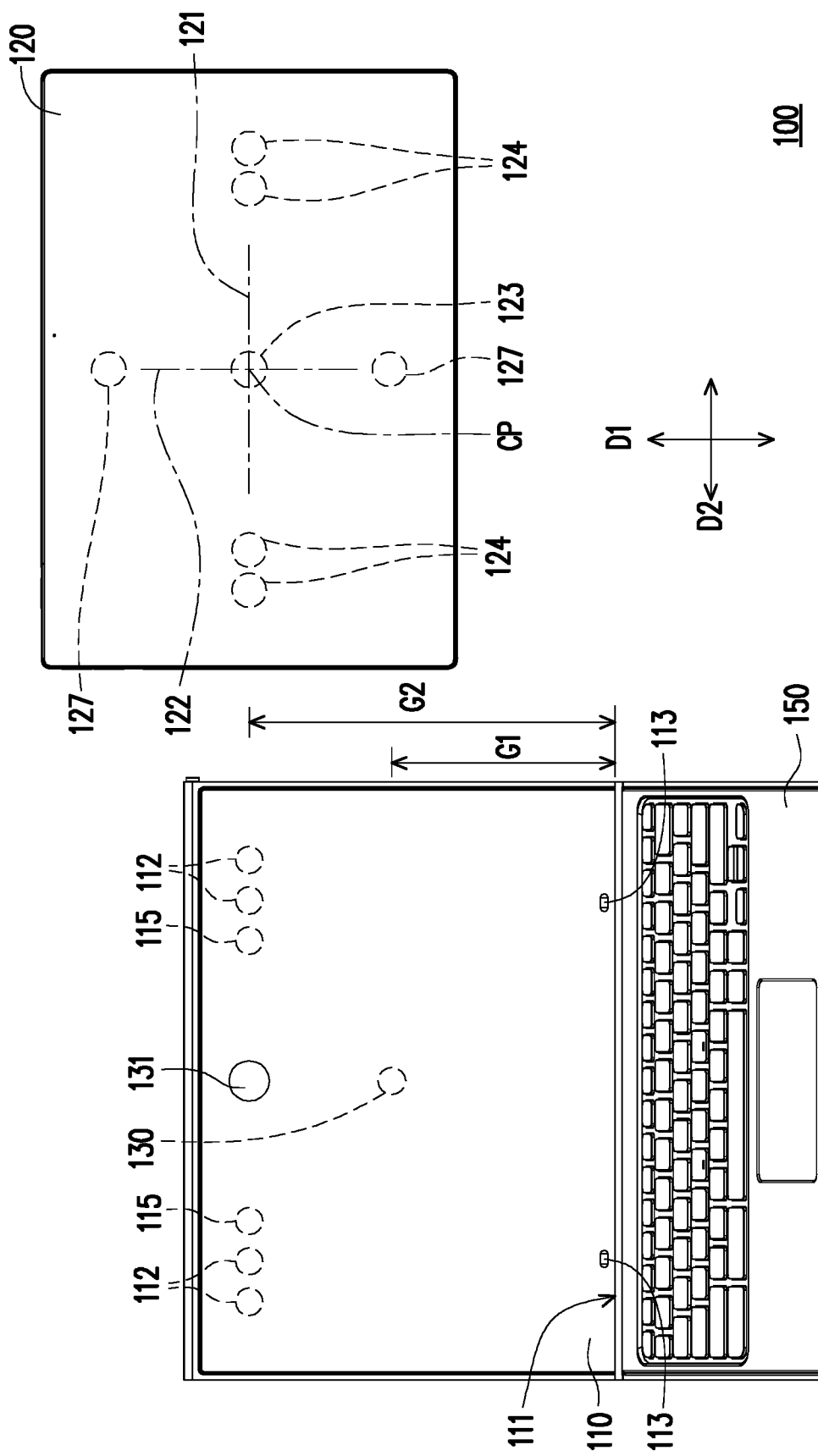
FIG. 1E is a schematic front view of the body of FIG. 1D separated from the supporting plate.
Figure 1F:
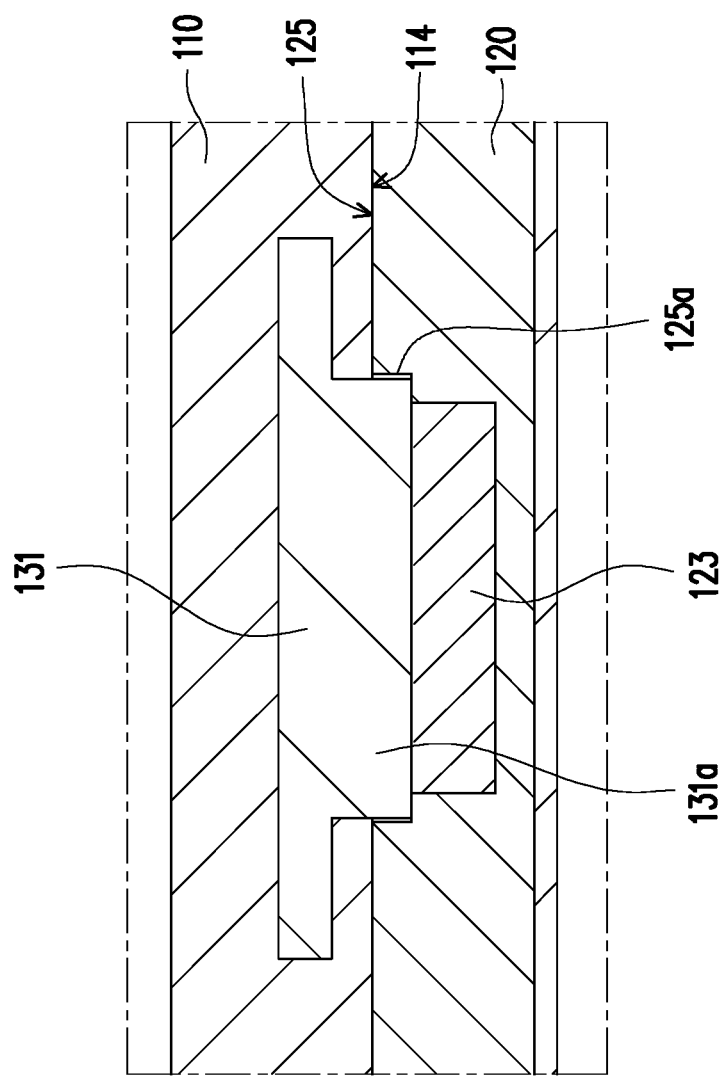
FIG. 1F is a schematic partial cross-sectional enlarged view showing an overlapping portion of a main auxiliary magnet and a second main positioning magnet in the electronic device of FIG. 1D.

FIG. 1D is a schematic front view of the electronic device in a second operation mode according to the first embodiment of the present disclosure. FIG. 1E is a schematic front view of the body of FIG. 1D separated from the supporting plate. FIG. 1F is a schematic partial cross-sectional enlarged view showing an overlapping portion of a main auxiliary magnet and a second main positioning magnet in the electronic device of FIG. 1D. Referring to FIG. 1B, FIG. 1D and FIG. 1E, in the process that the body 120 shown in FIG. 1B is moved away from the supporting portion 113 along the direction D1, the main auxiliary magnet 123 is moved away from the first main positioning magnet 130. Since the second main positioning magnet 131 is located on the moving path of the main auxiliary magnet 123, and the first positioning magnetic structure 112 is located on the moving path of the first auxiliary magnetic structure 124, once the main auxiliary magnet 123 is aligned (or overlapped) with the second main positioning magnet 131, and the first auxiliary magnetic structure 124 is aligned (or overlapped) with the first positioning magnetic structure 112, the main auxiliary magnet 123 is magnetically attracted to the second main positioning magnet 131, and the first auxiliary magnetic structure 124 is magnetically attracted to the first positioning magnetic structure 112.

On this occasion, the first axis 121 of the body 120 is still parallel to the edge 111 of the supporting plate 110, but the body 120 is separated from the supporting portions 113. On the other hand, the main auxiliary magnet 123 and the first auxiliary magnetic structure 124 are both spaced apart from the edge 111 by the second distance G2.

Specifically, since the first positioning magnetic structure 112 is symmetrically disposed at two opposite sides of the second main positioning magnet 131, and the first auxiliary magnetic structure 124 is symmetrically disposed at two opposite sides of the main auxiliary magnet 123, in the case where the main auxiliary magnet 123 is magnetically attracted to the second main positioning magnet 131, and the first auxiliary magnetic structure 124 is magnetically attracted to the first positioning magnetic structure 112, the coordination of the main auxiliary magnet 123 and the second main positioning magnet 131 as well as the coordination of the first auxiliary magnetic structure 124 and the first positioning magnetic structure 112 generate at least three positioning points on the body 120, so that the body 120 would not slide or rotate arbitrarily relative to the supporting plate 110, as such the electronic device 100 is stably maintained in the second operation mode.

For example, the second main positioning magnet 131 in the supporting plate 110 and the main auxiliary magnet 123 in the body 120 may be integrated with a wireless transmission function, respectively. When the main auxiliary magnet 123 in the body 120 is aligned (or overlapped) with the second main positioning magnet 131 in the supporting plate 110, the main auxiliary magnet 123 and the second main positioning magnet 131 can be paired and linked to transmit signals or electric power. On the other hand, the input device 150 is electrically connected to the main auxiliary magnet 123 in the supporting plate 110 to be electrically connected to the body 120 through the main auxiliary magnet 123 and the second main positioning magnet 131.

Referring to FIG. 1D to FIG. 1F, in order to improve the operational stability and reliability of the electronic device 100 in the second operation mode, the second main positioning magnet 131 and the main auxiliary magnet 123 may be matched concave and convex structures. Further, the supporting plate 110 has a bearing surface 114, and the second main positioning magnet 131 includes a positioning protrusion 131a protruding from the bearing surface 114. On the other hand, the body 120 has a leaning surface 125 and a positioning recess 125a located at the leaning surface 125, wherein the main auxiliary magnet 123 is located in the positioning recess 125a. When the leaning surface 125 of the body 120 abuts against the bearing surface 114 of the supporting plate 110, and the main auxiliary magnet 123 is aligned (or overlapped) with the second main positioning magnet 131, the positioning protrusion 131a is embedded in the positioning recess 125a to limit the degree of freedom of sliding movement of the body 120 relative to the supporting plate 110. The coordination of the first auxiliary magnetic structure 124 and the first positioning magnetic structure 112 can be configured to limit the degree of freedom of rotation movement of the body 120 relative to the supporting plate 110.

For example, the leaning surface 125 of the body 120 may be provided with a skin layer or a coating layer to reduce the friction when the leaning surface 125 of the body 120 slides or rotates on the bearing surface 114 of the supporting plate 110. Alternatively, the bearing surface 114 of the supporting plate 110 may be provided with a skin layer or a coating layer to reduce the friction when the leaning surface 125 of the body 120 slides or rotates on the bearing surface 114 of the supporting plate 110. Alternatively, the leaning surface 125 of the body 120 and the bearing surface 114 of the supporting plate 110 are both provided with a skin layer or a coating layer.

Figure 1G:
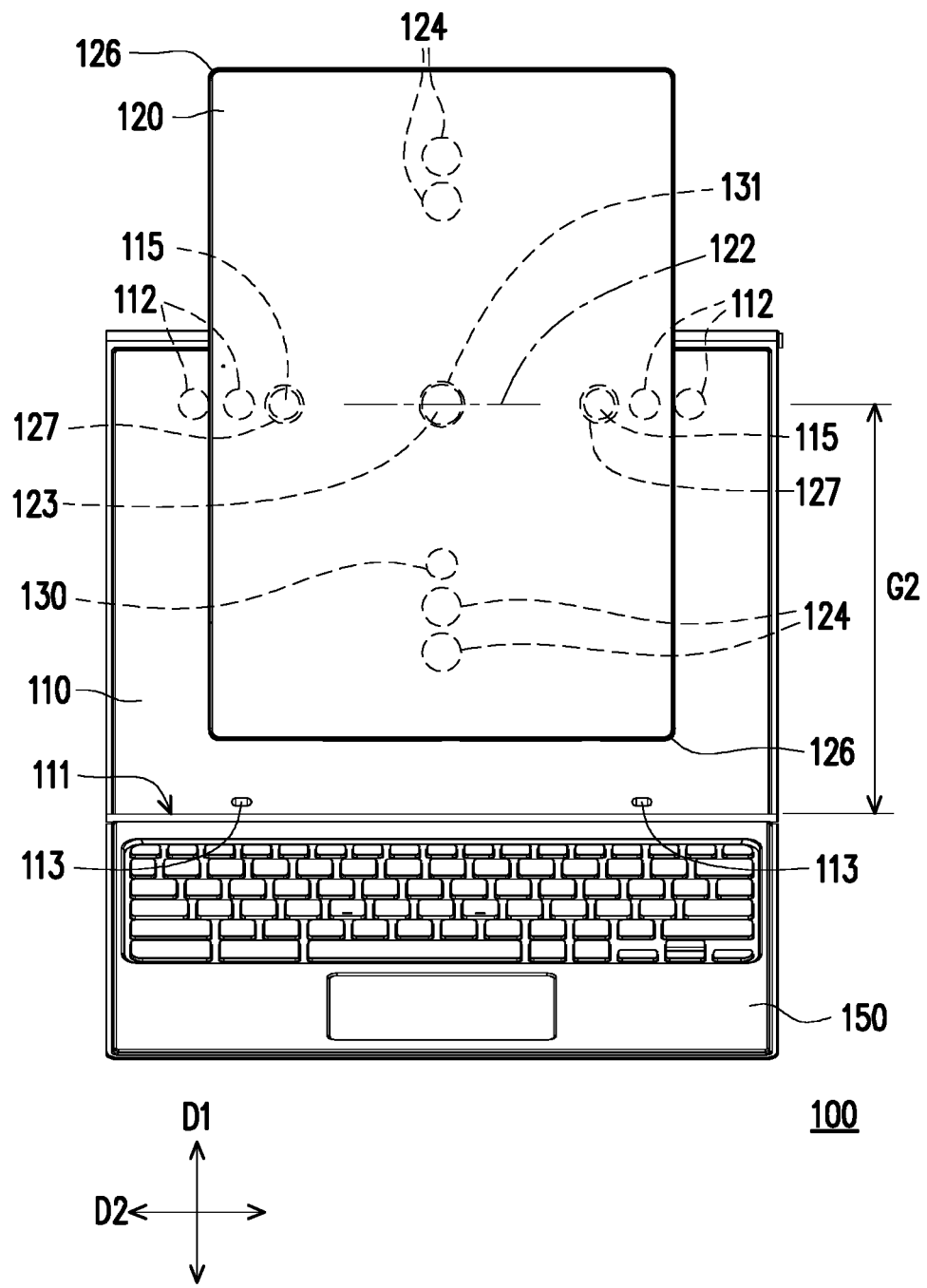
FIG. 1G is a schematic front view of the electronic device in a third operation mode according to the first embodiment of the present disclosure.
Figure 1H:
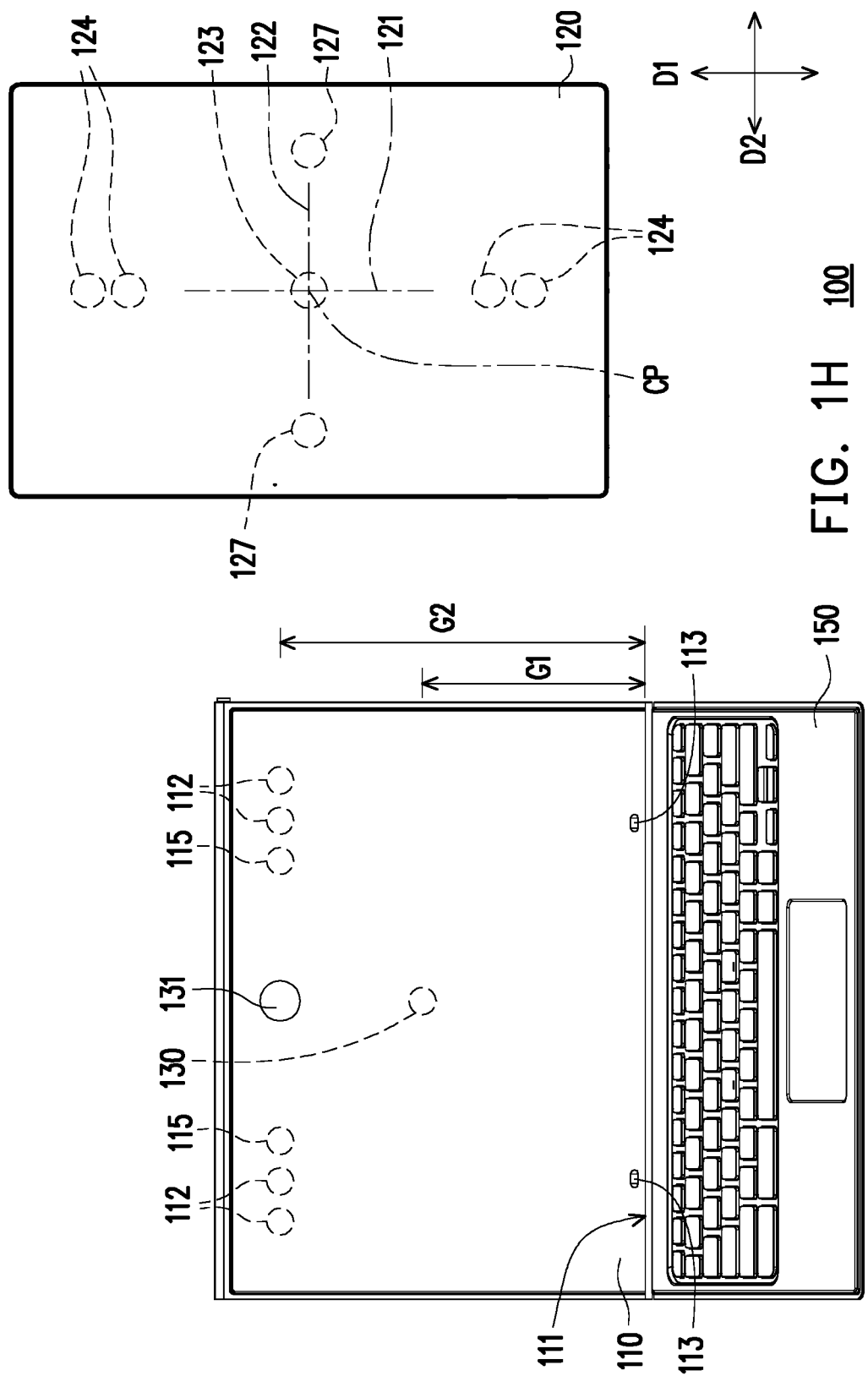
FIG. 1H is a schematic front view of the body of FIG. 1G separated from the supporting plate.

FIG. 1G is a schematic front view of the electronic device in a third operation mode according to the first embodiment of the present disclosure. FIG. 1H is a schematic front view of the body of FIG. 1G separated from the supporting plate. Referring to FIG. 1D, FIG. 1F, FIG. 1G, and FIG. 1H, the positioning protrusion 131a may serve as a rotation fulcrum when the body 120 rotates relative to the supporting plate 110, and the body 120 in the second operation mode can rotate relative to the supporting plate 110 to switch to the third operation mode. Further, the body 120 has a plurality of corners 126, and the distance between any one of the corners 126 and the center point of the main auxiliary magnet 123 is smaller than the second distance G2. In this manner, in the process that the body 120 is rotated relative to the supporting plate 110 through the coordination of the main auxiliary magnet 123 and the second main positioning magnet 131, the body 120 would not contact or collide with the input device 150 or the desktop (not shown).

On the other hand, the body 120 is further provided with a second auxiliary magnetic structure 127 therein located on the second axis 122, and the supporting plate 110 is further provided with a second positioning magnetic structure 115 therein. For example, the second auxiliary magnetic structure 127 may include a plurality of magnets arranged along the second axis 122, and the second auxiliary magnetic structure 127 is symmetrically disposed at two opposite sides of the main auxiliary magnet 123. On the other hand, the second positioning magnetic structure 115 is located between the first positioning magnetic structure 112 and the second main positioning magnet 131, and the second positioning magnetic structure 115 may include a plurality of magnets arranged along the direction D2, wherein the second positioning magnetic structure 115 is symmetrically disposed at two opposite sides of the second main positioning magnet 131, and the connecting line between the second positioning magnetic structure 115 and the second main positioning magnet 131 is substantially parallel to the edge 111. The second positioning magnetic structure 115 is spaced apart from the edge 111 by the second distance G2, and the number of the magnets of the second positioning magnetic structure 115 is substantially the same as the number of the magnets of the second auxiliary magnetic structure 127.

If the body 120 is rotated relative to the supporting plate 110 through the coordination of the main auxiliary magnet 123 and the second main positioning magnet 131, the magnets of the second positioning magnetic structure 115 are located on the moving path of the magnets of the second auxiliary magnetic structure 127. In the process that the body 120 is rotated relative to the supporting plate 110, once the second axis 122 of the body 120 is parallel to the edge 111, the second auxiliary magnetic structure 127 is aligned (overlapped) with the second positioning magnetic structure 115 is magnetically attracted to the second positioning magnetic structure 115.

In the case where the main auxiliary magnet 123 is magnetically attracted to the second main positioning magnet 131, and the second auxiliary magnetic structure 127 is magnetically attracted to the second positioning magnetic structure 115, the coordination of the main auxiliary magnet 123 and the second main positioning magnet 131 as well as the coordination of the second auxiliary magnetic structure 127 and the second positioning magnetic structure 115 generate at least three positioning points on the body 120, so that the body 120 would not slide or rotate arbitrarily relative to the supporting plate 110, as such the electronic device 100 is stably maintained in the third operation mode, wherein the coordination of the second auxiliary magnetic structure 127 and the second positioning magnetic structure 115 can be configured to limit the degree of freedom of rotation movement of the body 120 relative to the supporting plate 110. On the other hand, the body 120 in the third operation mode is maintained at a distance from the supporting portions 113.

Other embodiments will be described below, and mainly the differences between the embodiments will be explained. Descriptions related to similar or identical structural configurations, design principles or technical effects in these embodiments will not be repeated herein.

Figure 2A:
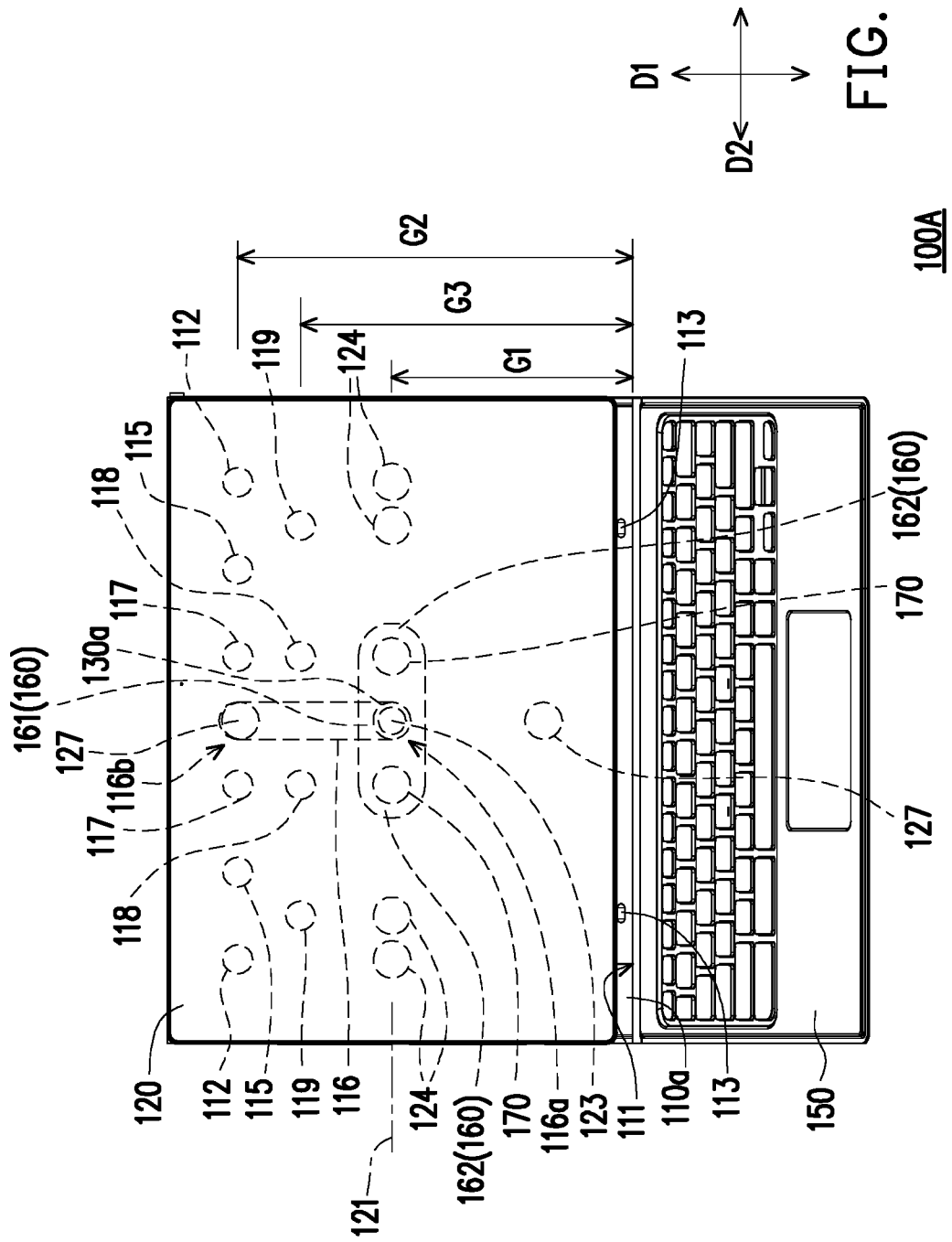
FIG. 2A is a schematic front view of an electronic device in a first operation mode according to a second embodiment of the present disclosure.
Figure 2B:
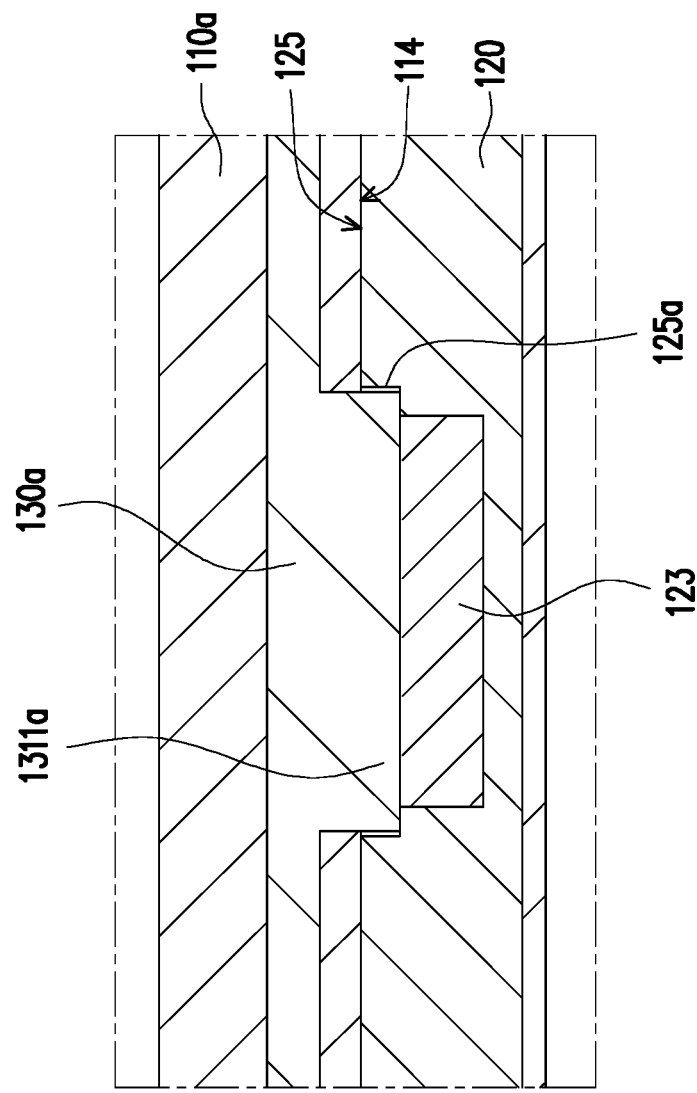
FIG. 2B is a schematic partial cross-sectional enlarged view showing an overlapping portion of a main auxiliary magnet and a main positioning magnet in the electronic device of FIG. 2A.

FIG. 2A is a schematic front view of an electronic device in a first operation mode according to a second embodiment of the present disclosure. FIG. 2B is a schematic partial cross-sectional enlarged view showing an overlapping portion of a main auxiliary magnet and a main positioning magnet in the electronic device of FIG. 2A. Referring to FIG. 2A and FIG. 2B, the main difference between an electronic device 100A of the present embodiment and the electronic device 100A of the first embodiment is that the electronic device 100A only includes one main positioning magnet 130a, and the main positioning magnet 130a can slide along the direction D1 perpendicular to the edge 111. Further, the supporting plate 110a has a sliding slot 116 extending along the direction D1, and the main positioning magnet 130a is slidably disposed in the sliding slot 116. The sliding slot 116 has a first end 116a close to the edge 111 and a second end 116b far away from the edge 111. In the first operation mode, the main positioning magnet 130a is positioned at the first end 116a and spaced apart from the edge 111 by the first distance G1.

In this embodiment, the main positioning magnet 130a and the main auxiliary magnet 123 in the body 120 may be matched concave and convex structures. Further, the supporting plate 110a has a bearing surface 114, and the main positioning magnet 130a includes a positioning protrusion 1311a protruding from the bearing surface 114. On the other hand, the body 120 has a leaning surface 125 and a positioning recess 125a located at the leaning surface 125, wherein the main auxiliary magnet 123 is located in the positioning recess 125a. When the leaning surface 125 of the body 120 abuts against the bearing surface 114 of the supporting plate 110a, and the main auxiliary magnet 123 is aligned (or overlapped) with the main positioning magnet 130a, the positioning protrusion 1311a is embedded in the positioning recess 125a. Therefore, the body 120 can slide along the direction D1 on the supporting plate 110a through the coordination of the main auxiliary magnet 123 and the main positioning magnet 130a.

In the embodiment, the electronic device 100A further includes a sliding member 160 and a lateral magnetic positioning member 170, wherein the sliding member 160 is slidably disposed in the supporting plate 110a, and the sliding member 160 includes a first sliding portion 161 located inside the sliding slot 116 and a second sliding portion 162 located outside the sliding slot 116. The main positioning magnet 130a is disposed at the first sliding portion 161, and the lateral magnetic positioning member 170 is disposed at the second sliding portion 162. For example, the second sliding portion 162 includes two lateral wings, and the lateral wings are respectively located at two opposite sides of the first sliding portion 161. The number of the lateral magnetic positioning member 170 is two, and are respectively disposed at the lateral wings of the second sliding portion 162, that is, each of the lateral wings is provided with one lateral magnetic positioning member 170. Further, the lateral magnetic positioning members 170 and the main positioning magnet 130a are arranged along the direction D2, wherein the lateral magnetic positioning members 170 are symmetrically disposed at two opposite sides of the sliding slot 116, and the main positioning magnet 130a is located between the lateral magnetic positioning members 170.

Figure 2C:
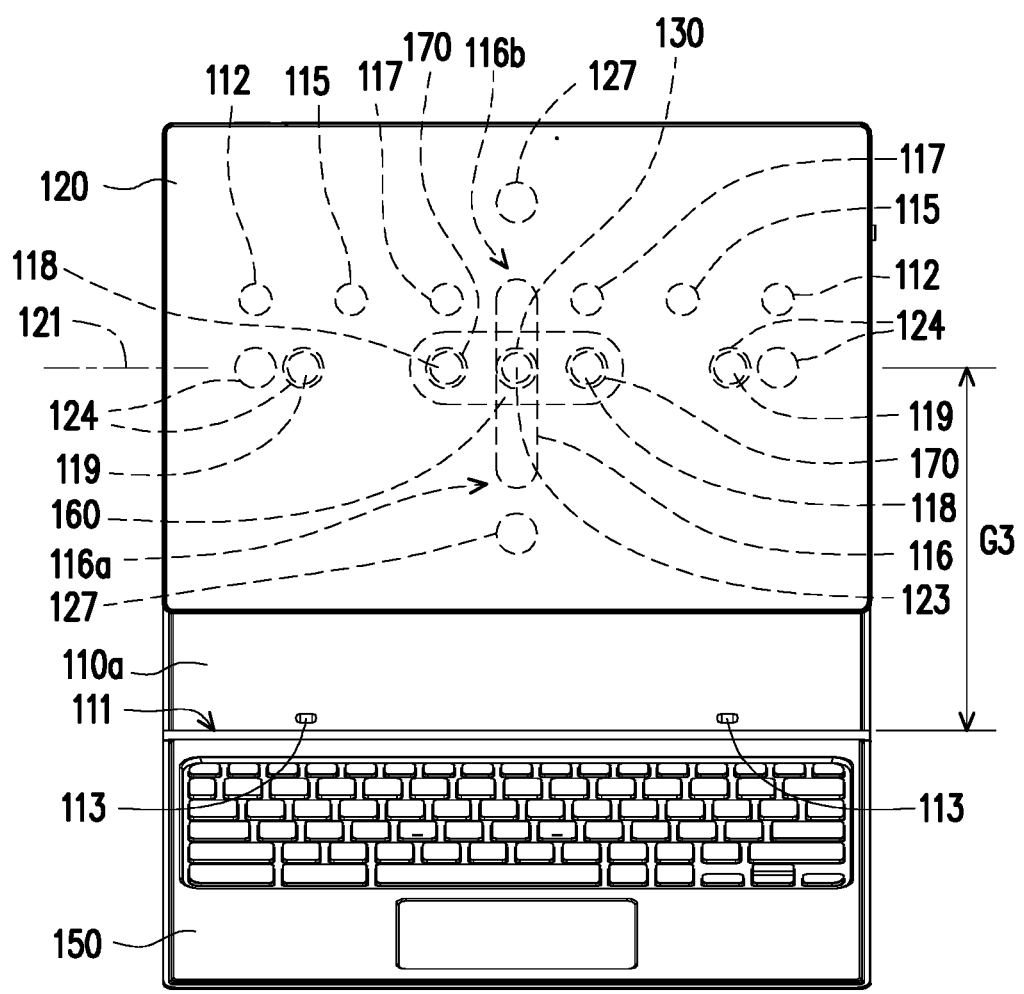
FIG. 2C is a schematic front view of the electronic device in a transitional operation mode according to the second embodiment of the present disclosure.
Figure 2D:
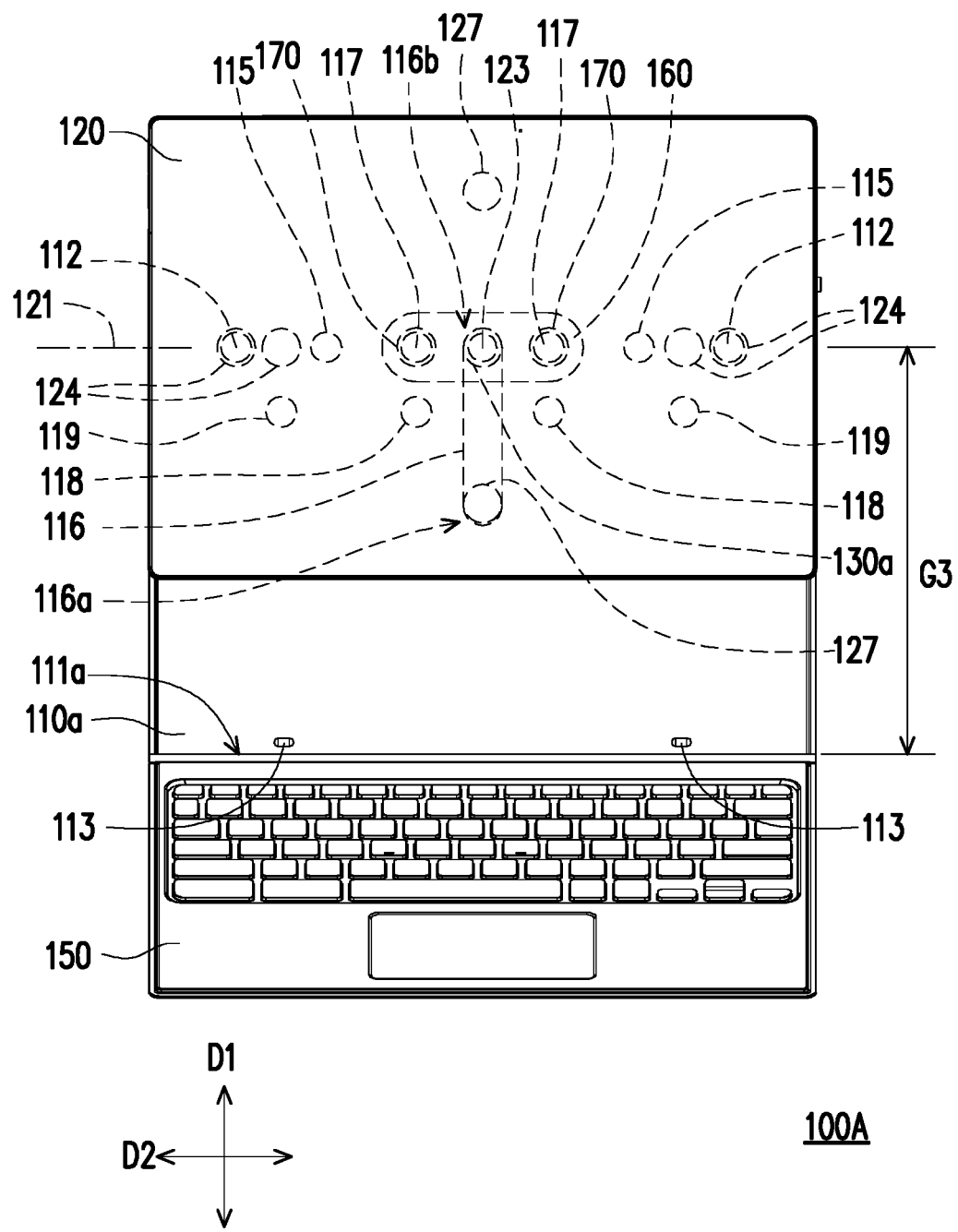
FIG. 2D is a schematic front view of the electronic device in a second operation mode according to the second embodiment of the present disclosure.

FIG. 2C is a schematic front view of the electronic device in a transitional operation mode according to the second embodiment of the present disclosure. FIG. 2D is a schematic front view of the electronic device in a second operation mode according to the second embodiment of the present disclosure. Referring to FIG. 2A, FIG. 2C and FIG. 2D, in the embodiment, the supporting plate 110a is further provided with a terminal magnetic positioning member 117 and a transitional magnetic positioning member 118 therein, wherein the terminal magnetic positioning member 117 is located at a side of the second end 116b of the sliding slot 116 and is spaced apart from the edge 111 by the second distance G2, and the transitional magnetic positioning member 118 is located between the edge 111 and the terminal magnetic positioning member 117. Further, the transitional magnetic positioning member 118 is located at a side of the sliding slot 116 and is spaced apart from the edge 111 by a third distance G3, and the third distance G3 is smaller than the second distance G2 and greater than the first distance G1.

For example, the number of the terminal magnetic positioning member 117 is two, and the number of the transitional magnetic positioning member 118 is two. The terminal magnetic positioning members 117 are symmetrically disposed at two opposite sides of the sliding slot 116, and the transitional magnetic positioning members 118 are symmetrically disposed at two opposite sides of the sliding slot 116. On any side of the sliding slot 116, the terminal magnetic positioning member 117 and the transitional magnetic positioning member 118 are arranged along the direction D1, and the terminal magnetic positioning member 117 and the transitional magnetic positioning member 118 are located on the moving path of the lateral magnetic positioning member 170.

If the electronic device 100A in the first operation mode is switched to the transitional operation mode, the main auxiliary magnet 123 and the main positioning magnet 130a are always aligned (or overlapped) with each other, and the body 120 and the sliding member 160 slide relative to the supporting plate 110a along the direction D1 and move away from the supporting portion 113. Also, the main positioning magnet 130a moves away from the first end 116a, until each of the lateral magnetic positioning members 170 is aligned (overlapped) with the corresponding transitional magnetic positioning member 118 and is magnetically attracted to the corresponding transitional magnetic positioning member 118, the body 120 and the sliding member 160 stop sliding. On this occasion, the main auxiliary magnet 123 is spaced apart from the edge 111 by the third distance G3.

On the other hand, the supporting plate 110a is further provided with a middle positioning magnetic structure 119 therein, and the middle positioning magnetic structure 119 is spaced apart from the edge 111 by the third distance G3. For example, the middle positioning magnetic structure 119 may include a plurality of magnets arranged along the direction D2, wherein the middle positioning magnetic structure 119 is symmetrically disposed at two opposite sides of the sliding slot 116, and the transitional magnetic positioning members 118 are located between the middle positioning magnetic structures 119, and the connecting line between the middle positioning magnetic structure 119 and the transitional magnetic positioning members 118 is substantially parallel to the edge 111.

In the process that the body 120 slides relative to the supporting plate 110 along the direction D1 and moves away from the supporting portion 113, the middle positioning magnetic structure 119 is located on the moving path of the first auxiliary magnetic structure 124. Once the first auxiliary magnetic structure 124 is aligned (or overlapped) with the middle positioning magnetic structure 119, the first auxiliary magnetic structure 124 is magnetically attracted to the middle positioning magnetic structure 119. On this occasion, the first axis 121 of the body 120 is still parallel to the edge 111 of the supporting plate 110, but the body 120 is separated from the support portions 113. In the case where the main auxiliary magnet 123 is magnetically attracted to the main positioning magnet 130a, and the first auxiliary magnetic structure 124 is magnetically attracted to the middle positioning magnetic structure 119, the coordination of the main auxiliary magnet 123 and the main positioning magnet 130a as well as the coordination of the first auxiliary magnetic structure 124 and the middle positioning magnetic structure 119 generate at least three positioning points on the body 120, so that the body 120 would not slide or rotate arbitrarily relative to the supporting plate 110a, as such the electronic device 100A is stably maintained in the transitional operation mode as shown in FIG. 2C.

Referring to FIG. 2C and FIG. 2D, if the electronic device 100A in the transitional operation mode is switched to the second operation mode, the main auxiliary magnet 123 and the main positioning magnet 130a are always aligned (or overlapped) with each other, and the body 120 and the sliding member 160 slide relative to the supporting plate 110a along the direction D1. Each of the lateral magnetic positioning members 170 moves away from the corresponding transitional magnetic positioning member 118 and moves toward the corresponding terminal magnetic positioning member 117, until each of the lateral magnetic positioning members 170 is aligned (overlapped) with the corresponding terminal magnetic positioning member 117 and magnetically attracted to the corresponding terminal magnetic positioning member 117, and the main positioning magnet 130a is moved toward the second end 116b, and the body 120 and the sliding member 160 stop sliding. On this occasion, the main auxiliary magnet 123 is spaced apart from the edge 111 by the second distance G2.

In continuation of the above, once the first auxiliary magnetic structure 124 is aligned (or overlapped) with the first positioning magnetic structure 112, the first auxiliary magnetic structure 124 is magnetically attracted to the first positioning magnetic structure 112. On this occasion, the first axis 121 of the body 120 is still parallel to the edge 111 of the supporting plate 110a, but the body 120 is separated from the supporting portions 113. In the case where the main auxiliary magnet 123 is magnetically attracted to the main positioning magnet 130a, and the first auxiliary magnetic structure 124 is magnetically attracted to the first positioning magnetic structure 112, the coordination of the main auxiliary magnet 123 and the main positioning magnet 130a as well as the coordination of the first auxiliary magnetic structure 124 and the first positioning magnetic structure 112 generate at least three positioning points on the body 120, so that the body 120 would not slide or rotate arbitrarily relative to the supporting plate 110a, as such the electronic device 100A is stably maintained in the second operation mode.

Figure 2E:
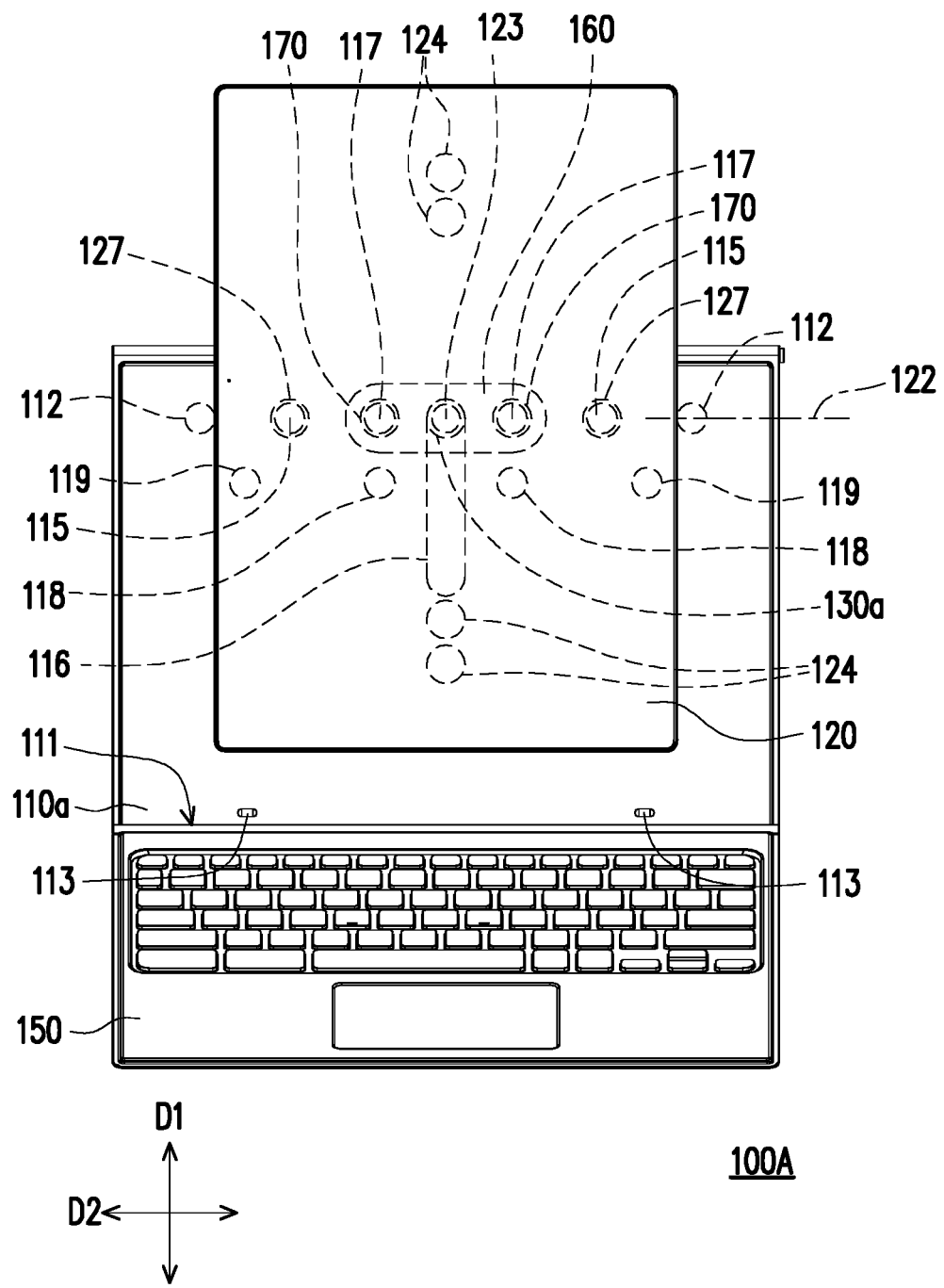
FIG. 2E is a schematic front view of the electronic device in a third operation mode according to the second embodiment of the present disclosure.

FIG. 2E is a schematic front view of the electronic device in a third operation mode according to the second embodiment of the present disclosure. Referring to FIG. 2D and FIG. 2E, the body 120 may be rotated relative to the supporting plate 110a through the coordination of the main auxiliary magnet 123 and the main positioning magnet 130a. Once the second axis 122 of the body 120 is parallel to the edge 111, the second auxiliary magnetic structure 127 is aligned (overlapped) with the second positioning magnetic structure 115 and magnetically attracted to the second positioning magnetic structure 115. In the case where the main auxiliary magnet 123 is magnetically attracted to the main positioning magnet 130a, and the second auxiliary magnetic structure 127 is magnetically attracted to the second positioning magnetic structure 115, the coordination of the main auxiliary magnet 123 and the main positioning magnet 130a as well as the coordination of the second auxiliary magnetic structure 127 and the second positioning magnetic structure 115 generate at least three positioning points on the body 120, so that the body 120 would not slide or rotate arbitrarily relative to the supporting plate 110a, as such the electronic device 100A is stably maintained in the third operation mode.

Specifically, in other embodiments, the magnetic attraction positioning mechanism corresponding to the transitional operation mode may be removed, that is, the transitional magnetic positioning member and the middle positioning magnetic structure are removed. Alternatively, the number of the transitional magnetic positioning members and the number of the middle positioning magnetic structures are increased so that the transitional operation mode has more positioning points.

Figure 3:
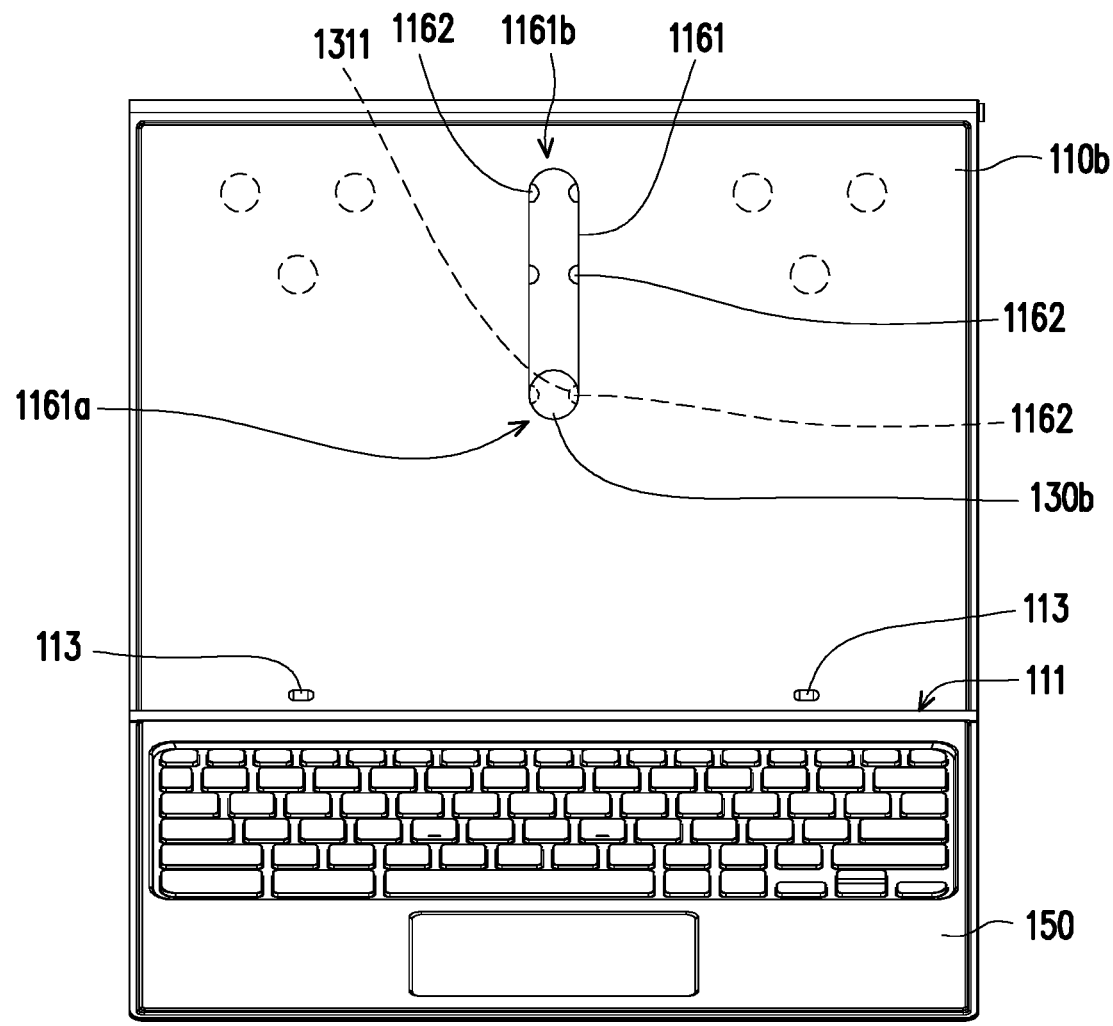
FIG. 3 is a schematic view of an electronic device according to a third embodiment of the present disclosure.

FIG. 3 is a schematic view of an electronic device according to a third embodiment of the present disclosure. In order to clearly show the structural design of the supporting plate 110b, the body 120 is omitted in FIG. 3. Referring to FIG. 3, different from the electronic device 100A of the second embodiment, the main positioning magnet 130b and the sliding slot 1161 on the supporting plate 110b of the electronic device 100B of the present embodiment adopt an engagement positioning mechanism without the configuration of the sliding member 160, the lateral magnetic positioning member 170, the terminal magnetic positioning member 117, and the transitional magnetic positioning member 118 of the second embodiment.

Further, the main positioning magnet 130b has a first engaging portion 1311, and the sliding slot 1161 is provided with a plurality of second engaging portions 1162 therein. The second engaging portions 1162 coordinate with the first engaging portion 1311 and are located on the moving path of the first engaging portion 1311. The second engaging portions 1162 and the first engaging portion 1311 may be an engagement of protrusions and slot. For example, a part of the second engaging portions 1162 is located at the first end 1161a of the sliding slot 1161, and another part of the second engaging portions 1162 is located at the second end 1161b of the sliding slot 1161, and yet another part of the second engaging portions 1162 is located between the first end 1161a and the second end 1161b. Therefore, the main positioning magnet 130b can be engaged with different second engaging portions 1162 through the first engaging portion 1311 to be positioned at different positions of the sliding slot 1161. In other embodiments, it can be selected that the second engaging portions are not provided between the first end and the second end of the sliding slot.

In summary, the electronic device of the present disclosure includes a body and a supporting plate for carrying the body, and the user can adjust the position or the direction of the body on the supporting plate according to individual needs, so as to obtain different operation modes. On the other hand, the electronic device of the present disclosure adopts a magnetic attraction positioning mechanism. When the position or the direction of the body on the supporting plate is adjusted, the body can be positioned on the supporting plate through the magnetic attraction positioning mechanism, so the body would not slide or rotate arbitrarily relative to the supporting plate, thereby improving the reliability in operating the electronic device.

Although the present disclosure has been disclosed in the above embodiments, it is not intended to limit the present disclosure, and those skilled in the art can make some modifications and refinements without departing from the spirit and scope of the disclosure. Therefore, the scope to be protected by the present disclosure is subject to the scope defined by the appended claims.

What is claimed is:

1. An electronic device, comprising:
a supporting plate, having an edge, the supporting plate provided with a first positioning magnetic structure therein;
a main positioning magnet, disposed at the supporting plate; and
a body, movably disposed at the supporting plate, wherein the body has a first axis and a second axis intersected with the first axis, and the body is provided with a main auxiliary magnet and a first auxiliary magnetic structure therein, the main auxiliary magnet is located at an intersection of the first axis and the second axis, and the first auxiliary magnetic structure is located on the first axis,
the main auxiliary magnet is configured to be aligned with the main positioning magnet and magnetically attracted to the main positioning magnet,
wherein the supporting plate has a sliding slot extending in a direction perpendicular to the edge, and the positioning magnet is slidably disposed in the sliding slot, the sliding slot has a first end close to a center of the supporting plate and a second end far away from the edge, the main positioning magnet is slidable to the first end and is spaced apart from the edge by a first distance, and the main positioning magnet is slidable to the second end and is spaced apart from the edge by a second distance, wherein the second distance is greater than the first distance,
wherein the electronic device further comprises a sliding member and a lateral magnetic positioning member, wherein the sliding member is slidably disposed in the supporting plate, and the sliding member comprises a first sliding portion disposed inside the sliding slot and a second sliding portion disposed outside the sliding slot, the main positioning magnet is disposed at the first sliding portion, and the lateral magnetic positioning member is disposed at the second sliding portion,
wherein the supporting plate is further provided with a terminal magnetic positioning member therein, and the terminal magnetic positioning member is located adjacent to the second end of the sliding slot and is spaced apart from the edge by the second distance, wherein the terminal magnetic positioning member is located on a moving path of the lateral magnetic positioning member.

2. The electronic device of claim 1, wherein the supporting plate is further provided with a transitional magnetic positioning member therein located between the edge and the terminal magnetic positioning member, and the transitional magnetic positioning member is located at a side of the sliding slot and is spaced apart from the edge by a third distance, wherein the transitional magnetic positioning member is located on a moving path of the lateral magnetic positioning member, and the third distance is between the first distance and the second distance.

3. The electronic device of claim 2, wherein the supporting plate is further provided with a middle positioning magnetic structure therein, and the middle positioning magnetic structure is spaced apart from the edge by the third distance, the middle positioning magnetic structure is located on a moving path of the first auxiliary magnetic structure.

4. The electronic device of claim 1, wherein the main positioning magnet has a first engaging portion, and the sliding slot is provided with a plurality of second engaging portions therein, one of the second engaging portions is located at the first end, and another one of the second engaging portions is located at the second end.

5. The electronic device of claim 4, wherein yet another one of the second engaging portions is located between the first end and the second end.

6. The electronic device of claim 1, wherein the main positioning magnet is spaced apart from the edge by the first distance, the main auxiliary magnet is aligned with the main positioning magnet and is magnetically attracted to the main positioning magnet, wherein the main auxiliary magnet is spaced apart from the edge by the first distance, and the first auxiliary magnetic structure is spaced apart from the edge by the first distance.

7. The electronic device of claim 6, wherein the first axis is parallel to the edge.

8. The electronic device of claim 6, wherein the supporting plate comprises a supporting portion adjacent to the edge, and the body abuts against the supporting portion.

9. The electronic device of claim 1, wherein the main auxiliary magnet is aligned with the main positioning magnet and is magnetically attracted to the main positioning magnet, the first auxiliary magnetic structure is aligned with the first positioning magnetic structure and is magnetically attracted to the first positioning magnetic structure, wherein the main auxiliary magnet is spaced apart from the edge by the second distance, and the first auxiliary magnetic structure is spaced from the edge by the second distance.

10. The electronic device of claim 9, wherein the first axis is parallel to the edge.

11. The electronic device of claim 9, wherein the supporting plate comprises a supporting portion adjacent to the edge, and the body is separated from the supporting portion.

12. The electronic device of claim 1, wherein the supporting plate has a bearing surface, and the main positioning magnet comprises a positioning protrusion protruding from the bearing surface, the body has a leaning surface and a positioning recess located on the leaning surface, wherein the main auxiliary magnet is located in the positioning recess, the leaning surface abuts against the bearing surface, and the positioning protrusion is embedded in the positioning recess.

13. The electronic device of claim 1, further comprising:
a bracket, connected to the supporting plate, and the bracket and the body located at two opposite sides of the supporting plate.

14. The electronic device of claim 13, further comprising:
an input device, connected to the edge of the supporting plate, and the bracket and the input device being located at two opposite sides of the supporting plate.

* * * * *